US012727236B2

(12) United States Patent
Lai et al.

(10) Patent No.: US 12,727,236 B2

(45) Date of Patent: Sep. 1, 2026

(54) SEMICONDUCTOR DEVICE WITH SCHOTTKY BARRIER INTERFACE AND MANUFACTURING METHOD THEREOF

(71) Applicant: TAIWAN SEMICONDUCTOR MANUFACTURING COMPANY LTD., Hsinchu (TW)

(72) Inventors: Yu-Ying Lai, Changhua County (TW); Po-Chih Su, New Taipei City (TW); Ruey-Hsin Liu, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 551 days.

(21) Appl. No.: 18/314,308

(22) Filed: May 9, 2023

(65) Prior Publication Data

US 2024/0379842 A1 Nov. 14, 2024

(51) Int. Cl.

*H10D 84/00* (2025.01)
*H10D 30/01* (2025.01)
*H10D 62/10* (2025.01)
*H10D 62/17* (2025.01)

(52) U.S. Cl.

CPC ....... *H10D 84/156* (2025.01); *H10D 30/0281* (2025.01); *H10D 62/116* (2025.01); *H10D 62/393* (2025.01)

(58) Field of Classification Search

CPC ............... H10D 62/116; H10D 62/393; H10D 30/0281; H10D 84/156

See application file for complete search history.

(56) References Cited

U.S. PATENT DOCUMENTS

2019/0140045 A1* 5/2019 Lo ........................ H10D 62/129
2024/0097051 A1* 3/2024 Li ........................ H10D 62/114

* cited by examiner

*Primary Examiner* — Fazli Erdem

(74) *Attorney, Agent, or Firm* — WPAT LAW; Anthony King

(57) ABSTRACT

The present disclosure provides a semiconductor device, including a substrate, a first dopant region in the substrate, wherein the first dopant is doped with a first conductivity type dopant, a first drift region at a top surface of the substrate, a first drain region adjacent to the first drift region, a second drain region, wherein an upper portion of the first dopant region is between the first drain region and the second drain region, and a first conductive layer connecting the first drain region, the second drain region, and a top surface of the upper portion of the first dopant region, wherein a Schottky barrier interface is formed between the top surface of the upper portion of the first dopant region and the first conductive layer.

20 Claims, 16 Drawing Sheets

10
Vin
OFF
M1
LX
OFF
M2
200
100B
100A
GND
P2
12
16
controller
Vout
13
13A
13B
R1
R2
14
Cout

SEMICONDUCTOR DEVICE WITH SCHOTTKY BARRIER INTERFACE AND MANUFACTURING METHOD THEREOF

BACKGROUND

Nowadays, due to rapid development in microelectronics, it is more complex in designing power systems. There are two main types of regulated power supplies available, a switching mode power supply and a linear power supply. Since the switching mode power supply is more efficient than the linear power supply, the switching power supply has become a popular trend and has been widely used in electronic devices, such as personal computers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2' is a top view of a semiconductor device, according to some embodiments of the present disclosure.

FIG. 7' is a top view of a semiconductor device, according to some embodiments of the present disclosure.

DETAILED DESCRIPTION

Figure 1A:
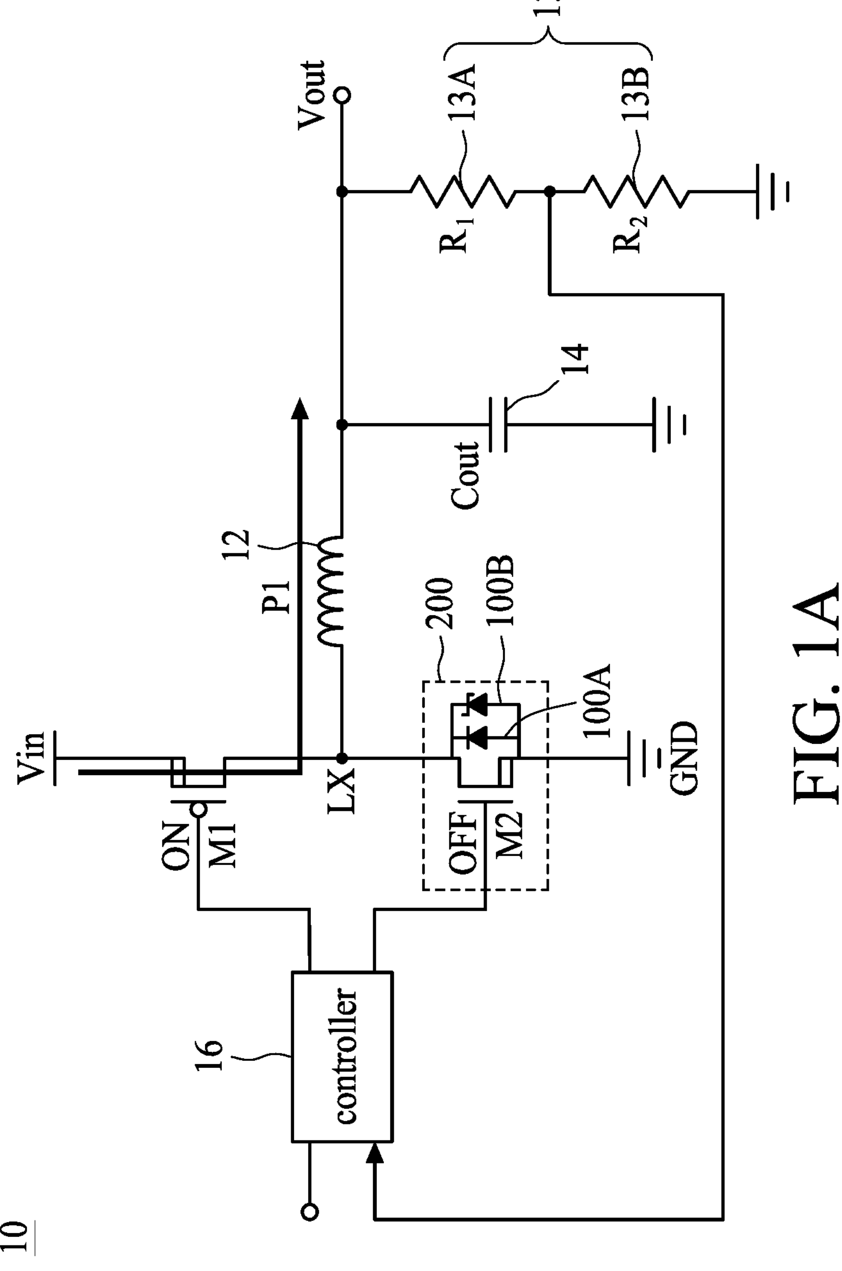
FIG. 1A is a diagram of a circuit in a first state, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In some power device application, it is important to increase switching frequency in order to achieve better efficiency. However, power device often face the issue of switching loss and conduction loss.

A "dead time" of a device refers to a period of time when both the high-side and low-side switches in a power device are off or in a non-conducting state. Theoretically, no current flows through the circuit during dead time. Dead time is thus introduced in power device to alleviate cross conduction or shoot-through, which could potentially cause short circuit and damage the circuit components. Dead time is usually introduced by using a controller (or driver circuit) that ensures that the high-side and low-side switches are not turned on simultaneously, and introduces a delay between the turn-off of one switch and the turn-on of the other switch in response thereto. It is important to control the duration of the dead time in order to balance the need for preventing shoot-through for minimizing power loss and preventing short circuit, while maximizing circuit efficiency. A dead time being too short may lead to shoot-through. A dead time being too long may lead to lower efficiency.

However, in practice, during the transition of a diode being switched from forward conducting state to reverse blocking state, the diode may experience a brief period of time wherein current continues to flow even after the voltage across the diode has been changed, which is referred to as reverse recovery phenomenon. This phenomenon continues until the reverse recovery current becomes zero.

Reverse recovery is one of the main contributors to power loss, wherein the power loss has positive correlation with a switching frequency. Further, reverse recovery behavior may also enlarge voltage overshoot due to large transient current. Alternatively stated, the issue of reverse recovery limits the efficiency and maximum operable switching frequency of a power device. The issue of reverse recovery may also decrease device performance or even the reliability. Thus, alleviating reverse recovery current is also a challenge for power device application.

The present disclosure provides some embodiments of semiconductor device incorporated with a Schottky barrier interface and method for forming the same to address the aforesaid issues. Furthermore, the approach in the present disclosure improves area cost.

In addition, Schottky barrier interface possess advantages such as high switching speed and desired capacitance value, which can be used in power rectification (such as a buck converter), signal detection, or high-frequency switching applications.

Referring to FIG. 1A. FIG. 1A is a diagram of a circuit in a first state, according to some embodiments of the present disclosure. FIG. 1A is a diagram of a circuit 10 in a first state, which is an operating state. The circuit 10 operates in a power domain defined between a power supply Vin and a reference level GND (which can be ground level in some embodiments). The circuit 10 is configured to convert the power supply Vin to a voltage Vout at an output. In some applications, for example, the circuit 10 is desired to operate under 5V. The circuit 10 includes a first transistor M1, a second transistor M2, an inductor 12, a resistor group 13, a capacitor 14, and a controller 16. The controller 16 may be a gate driver that functions to output a pulse signal to a gate of each of the first transistor M1 and the second transistor M2 so as to switch their states of conduction. The voltage level of the voltage Vout may depend on the duty cycle of the pulse signal. The resistor group 13 may include one or more resistors, for example, a first resistor 13A and a second resistor 13B. The first transistor M1 may be referred to as a high-side switch and the second transistor M2 may be referred to as a low-side switch.

In some embodiments, the first transistor M1 and the second transistor M2 may include transistors. A gate of the first transistor M1 is coupled to the controller 16. A source of the first transistor M1 receives the supply voltage Vin. A drain of the first transistor M1 is coupled to one end of the inductor 12. In some embodiments, the first transistor M1 includes a metal-oxide semiconductor (MOS) transistor. In some embodiments, the first transistor M1 includes a P-type MOS transistor. In some alternative embodiments, the first transistor M1 includes an N-type MOS transistor.

A gate of the second transistor M2 is coupled to the controller 16. A drain of the second transistor M2 is coupled to the drain of the first transistor M1 and also to the one end of the inductor 12. A source of the second transistor M2 is coupled to the reference level GND. The second transistor M2 may have a conductivity type opposite to that of the transistor M1. In some embodiments, the first transistor M2 includes an N-type MOS transistor. In some alternative embodiments, the first transistor M2 includes a P-type MOS transistor.

Moreover, the circuit 10 further includes a body diode 100A and a guiding unit 100B in parallel with the body diode 100A. The body diode 100A and the guiding unit 100B are integrated with (or coupled to) the second transistor M2. The body diode 100A may be a PN junction diode. The body diode 100A has an anode coupled to the source of the second transistor M2, and a cathode coupled to the transistor of the drain of the second transistor M2. In some embodiments, the second transistor M2 includes a laterally diffused MOS transistor (LDMOS). Alternatively stated, the body diode 100A and the guiding unit 100B are between the source side and the drain side of the second transistor M2. In some embodiments, the guiding unit 100B may include a Schottky diode, or alternatively, a device with Schottky barrier interface. The body diode 100A, the guiding unit 100B and the second transistor M2 are collectively referred to as a semiconductor device 200.

In operation, the first transistor M1 is turned on while the second transistor M2 is turned off in response to a pulse signal from the controller 16. Current from the power supply Vin flows via the source of the first transistor M1 to the drain of the first transistor M1 towards the output along a first path P1, charging the inductor 12 and the capacitor 14.

Figure 1B:
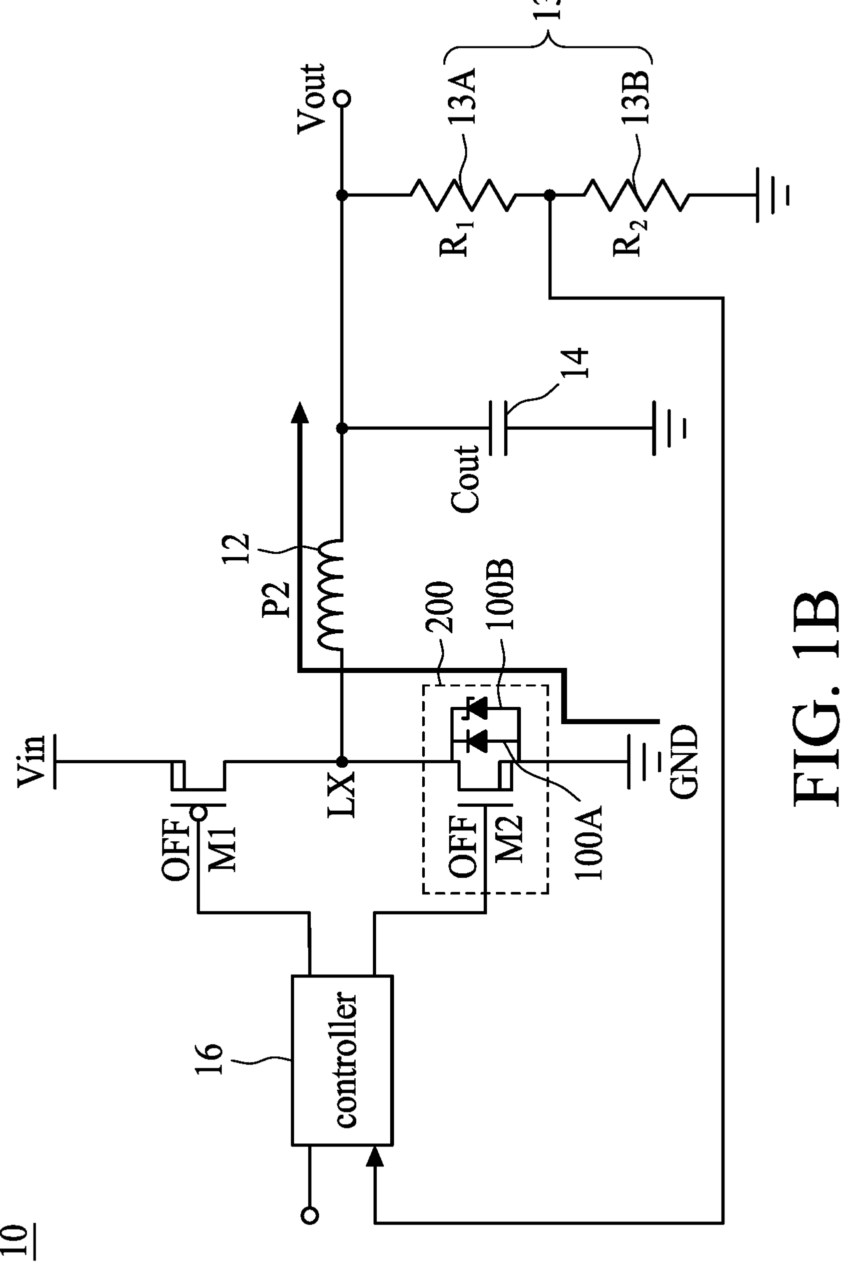
FIG. 1B is a diagram of a circuit under a second state, according to some embodiments of the present disclosure.

Referring to FIG. 1B. FIG. 1B is a diagram of a circuit under a second state, according to some embodiments of the present disclosure. FIG. 1B is a diagram of the circuit 10 in a second state, which is a turned-off state. To prevent a short-circuiting between the power supply Vin and the reference level GND, a period of time called "dead time" is introduced such that both the first transistor M1 and the second transistor M2 are maintained at the turned-off state. Subsequent to the first state (operating state), the controller 16 inverts the state of conduction of the circuit 10. Before inverting the state of conduction of the circuit 10, the first transistor M1 and the second transistor M2 are turned off during the dead time. Current from the reference level GND along a second path P2 still charges the inductor 12 and the capacitor 14 temporarily.

To alleviate the reverse recovery issue, the guiding unit 100B is connected in parallel with the body diode 100A in order to guide the current from the reference level GND. The guiding unit 100B has a forward threshold voltage lower than that of the body diode 100A, and the guiding unit 100B may include a Schottky diode, which is a unipolar device. Accordingly, the guiding unit 100B is conducted before the body diode 100A is conducted. A significant portion of the current from the reference level GND towards the output during the dead time flows through the guiding unit 100B instead of the body diode 100A. Thereby, the body diode reverse recovery issue for the body diode 100A is alleviated or even eliminated in some embodiments. The guiding unit 100B may also provide switch inductor current before the body diode 100A is turned on again. In summary, a Schottky diode is used to address the issue of body diode reverse recovery, and the Schottky diode is integrated with the body diode 100A in a semiconductor device 200, and thus has a relatively low area cost. Some embodiments of the semiconductor device 200 may include a semiconductor device 200A (shown in FIG. 2 or FIG. 2'), a semiconductor device 200B (shown in FIG. 6), a semiconductor device 200C (shown in FIG. 7 or FIG. 7'), a semiconductor device 200D (shown in FIG. 8), and a semiconductor device 200E (shown in FIG. 9). Alternatively stated, the semiconductor device 200A, the semiconductor device 200B, the semiconductor device 200C, the semiconductor device 200D, and the semiconductor device 200E may be equivalent to, implemented as, or similar to at least a portion of the semiconductor device 200 depicted in the diagrams of FIG. 1A and FIG. 1B.

In a comparative embodiment of a circuit free from a guiding unit 100B, the charging current would flow through the body diode 100A, and the undesired body diode reverse recovery is incurred. In the case of operating with greater switching frequency and/or greater operating current, the issues of voltage overshoot and power loss may become more significant, thus decreasing device performance.

Figure 2:
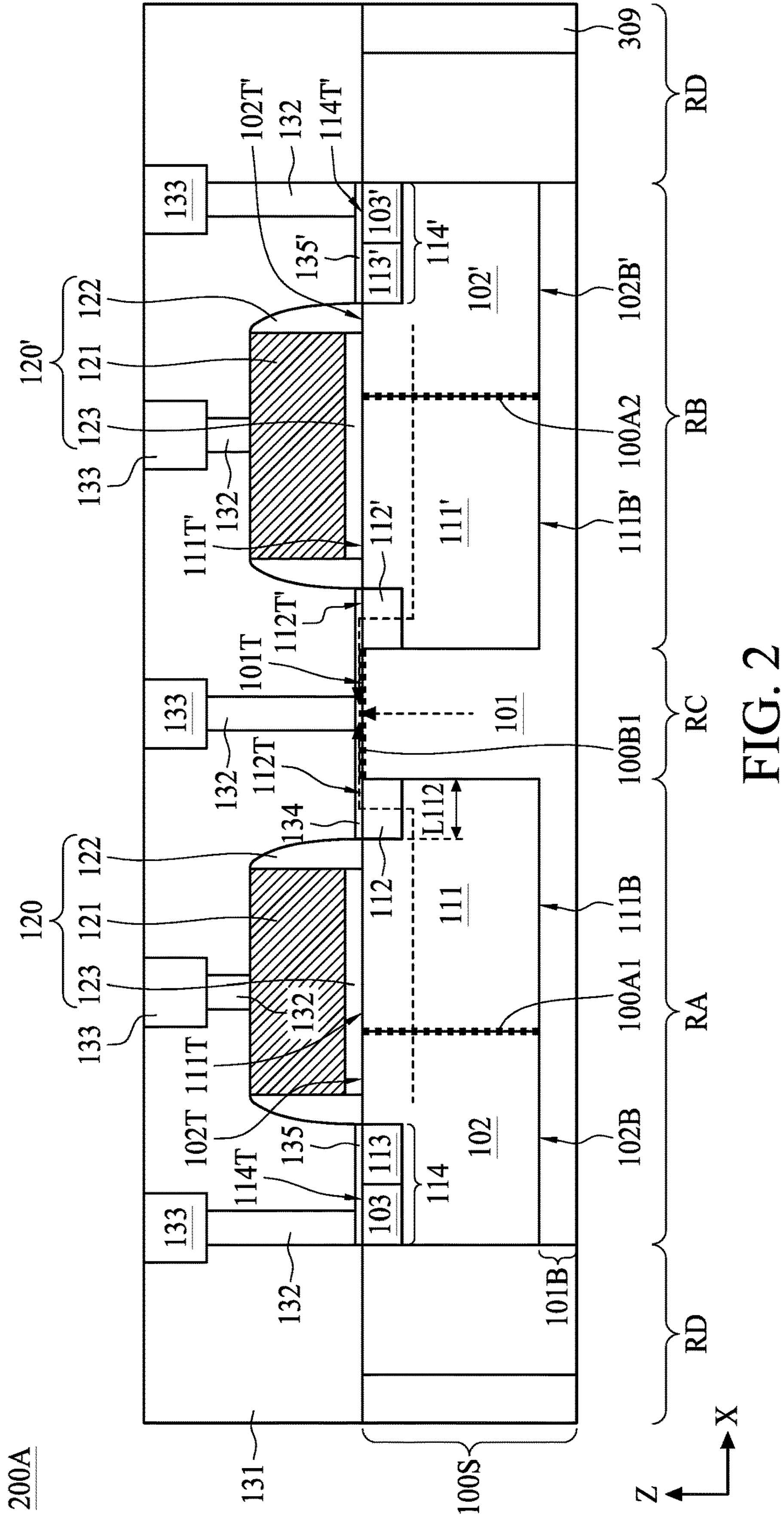
FIG. 2 is a cross sectional view of a semiconductor device, according to some embodiments of the present disclosure.
Figure 2:
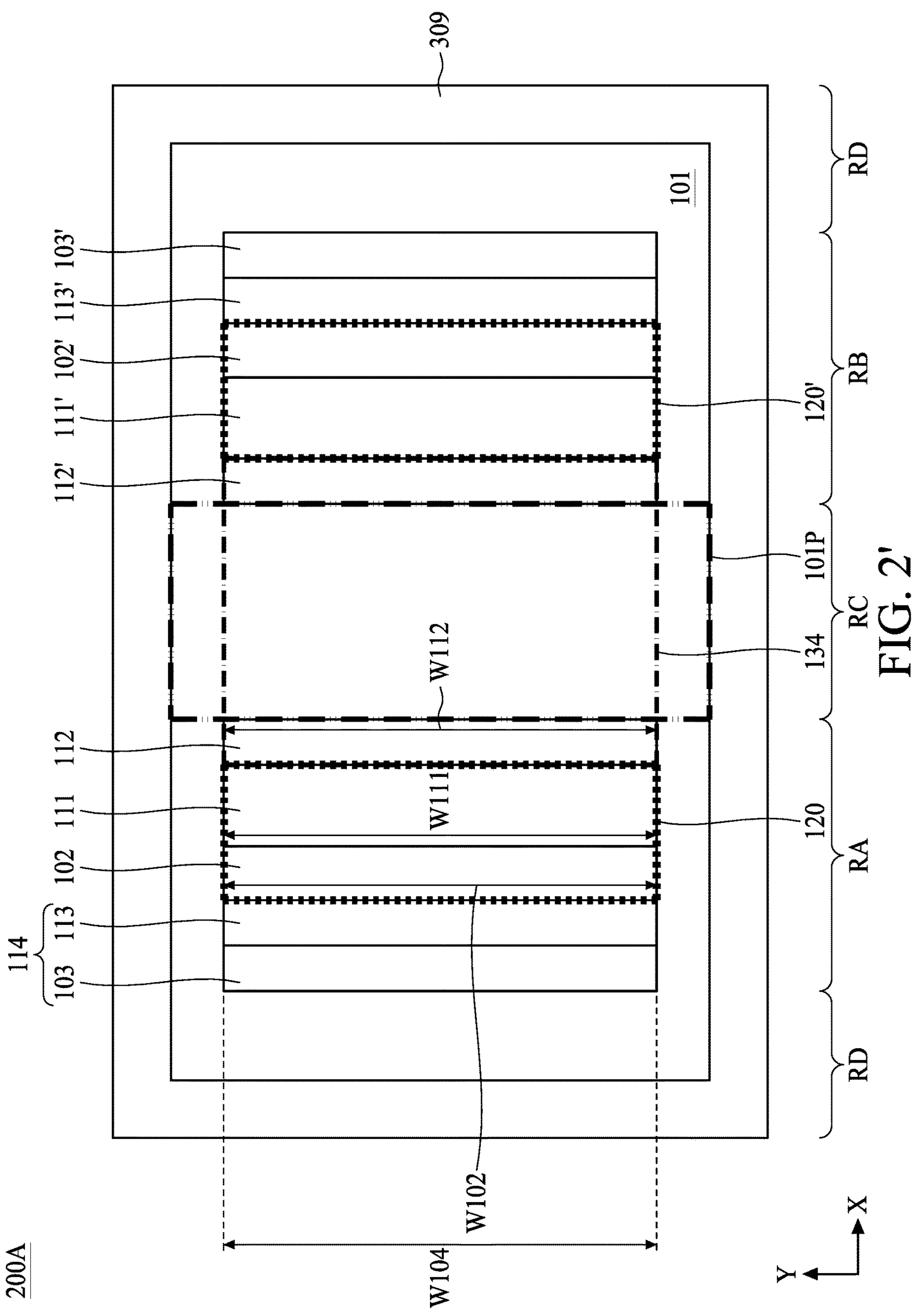

Referring to FIG. 2 and FIG. 2', FIG. 2 is a cross sectional view of a semiconductor device, and FIG. 2' is a top view of a semiconductor device, according to some embodiments of the present disclosure. A semiconductor structure 200A, which can be an embodiment of the semiconductor device 200 shown in FIG. 1A and FIG. 1B, include a substrate 100S. In some embodiments, the substrate 100S includes silicon. The substrate 100S may be a lightly doped P-type substrate or a substrate that inherently includes a slight amount of P-type dopant. The substrate 100S includes a first region RA, a second region RB, a third region RC, and a fourth region RD. The third region RC is between the first region RA and the second region RB. The first region RA is separated from the second region RB by the third region RC. The first region RA, the second region RB and the third region RC are at least partially surrounded by the fourth region RD in a lateral direction.

The substrate 100S includes a first dopant region 101, which has a first conductivity type dopant. In some embodiments, the first dopant region 101 is a part of the substrate 100S. In some embodiments, the first conductivity type dopant is P-type dopant, and the first dopant region 101 is a P-type region. A concentration of the first conductivity type dopant in the first dopant region is in a range from about 1E15 $cm^{-3}$ to about 1E16 $cm^{-3}$.

The substrate 100S further includes a first channel region 102 over the first region RA, a second channel region 102' over the second region RB, a first drift region 111 over the first region RA, a second drift region 111' over the second region RB, a first drain region 112 over the first region RA, a second drain region 112' over the second region RB, a first source region 114 over the first region RA, and a second source region 114' over the second region RB. The first source region 114 further includes a first area 103 and a second area 113 adjacent to the first region 103. The second source region 114' further includes a third area 103' and a fourth area 113' adjacent to the third region 103'. The second drift region 111' is apart from the first drift region 111.

The first drift region 111 is directly next to the first channel region 102. The first drain region 112 is at a top surface of the first drift region 111, and a side of the first drain region 112 is aligned with a side of a portion of the first drift region 111 directly below the first drain region 112. The first source region 114 is disposed at a top surface of the first channel region 102. A side of the first area 103 of the first source region 114 is aligned with a side of a portion of the first channel region 102 directly below the first source region 114. The first source region 114 is apart from the first drain region 112. A first diode junction 100A1 is formed at an interface between the first channel region 102 and the first drift region 111. The first diode junction 100A1 is over the first region RA.

The second drift region 111' is directly next to the second channel region 102'. The second drain region 112' is at a top surface of the second drift region 111', and a side of the second drain region 112' is aligned with a side of a portion of the second drift region 111' directly below the first second region 112'. The second source region 114' is disposed at a top surface of the second channel region 102'. A side of the third area 103' of the second source region 114' is aligned with a side of a portion of the second channel region 102' directly below the second source region 114'. The second source region 114' is apart from the second drain region 112'. A second diode junction 100A2 is formed at an interface between the second channel region 102' and the second drift region 111'. The second diode junction 100A2 is over the second region RB.

The first channel region 102 and the second channel region 102' are doped with the first conductivity type dopant. Concentrations of dopant in the first channel region 102 and the second channel region 102' are greater than the concentration of dopant in the first dopant region 101. For example, the concentration of dopant in the first channel region 102 and the second channel region 102' may be in a range from about 1E17 $cm^{-3}$ to about 1E19 $cm^{-3}$.

The first drift region 111 and the second drift region 111' are doped with a second conductivity type dopant. In some embodiments, the second conductivity type dopant is different from the first conductivity type dopant. In some embodiments, the second conductivity type dopant is N-type dopant. A concentration of dopant in the first drift region 111 and the second drift region 111' may be in a range from about 1E17 $cm^{-3}$ to about 1E19 $cm^{-3}$.

The first drain region 112 and the second drain region 112' are doped with the second conductivity type dopant. A concentration of dopant in the first drain region 112 and the second drain region 112' are greater than the concentration of dopant in the first drift region 111 and the second drift region 111'. For example, the concentration of dopant in the first drain region 112 and the second drain region 112' may be in a range from about 1E19 $cm^{-3}$ to about 1E21 $cm^{-3}$. In some embodiments, the first drain region 112 and the second drain region 112' are referred to herein as N+ regions.

The first area 103 of the first source region 114 and the third area 103' of the second source region 114' are doped with the first conductivity type dopant. A concentration of dopant in the first area 103 and the third area 103' are greater than the concentration of dopant in the first channel region 102 and the second channel region 102'. For example, the concentration of dopant in the first area 103 and the third area 103' may be in a range from about 1E19 $cm^{-3}$ to about 1E21 $cm^{-3}$. In some embodiments, the first area 103 and the third area 103' are referred to herein as the P+ regions.

The second area 113 of the first source region 114 and the fourth area 113' of the second source region 114' are doped with the second conductivity type dopant. A concentration of dopant in the second area 113 and the fourth area 113' are greater than the concentration of dopant in the first drift region 111 and the second drift region 111'. For example, the concentration of dopant in the second area 113 and the fourth area 113' may be in a range from about 1E19 $cm^{-3}$ to about 1E21 $cm^{-3}$. In some embodiments, the second area 113 of the first source region 114 and the fourth area 113' of the second source region 114' are N+ regions.

In the semiconductor structure 200A depicted in FIG. 2 and FIG. 2', a bottom 102B of the first channel region 102, a bottom 102B' of the second channel region 102', a bottom 111B of the first drift region 111 and a bottom 111B' of the second drift region 111' are aligned. The first dopant region 101 has an upper portion 101P between the first drift region 111 and the second drift region 111' so that the first drift region 111 is apart from the second drift region 111'. The first dopant region 101 may further have a lower portion 101B extending underneath the first drift region 111, the second drift region 111', the first channel region 102, and the second channel region 102'.

In some embodiments, a top surface 102T of the first channel region 102, a top surface 102T' of the second channel region 102', a top surface 111T of the first drift region 111, a top surface 111T' of the second drift region 111', a top surface 114T of the first source region 114, a top surface 114T' of the second source region 114', a top surface 112T of the first drain region 112, a top surface 112T' of the second drain region 112', and a top surface 101T of the first dopant region 101 are coplanar.

In some embodiments, the semiconductor structure 200A further includes a first conductive layer 134 directly in contact with the top surface 101T of the first dopant region 101, the first drain region 112, and the second drain region 112'. In some embodiments, at least a portion of the upper portion 101P of the first dopant region 101, the first drain region 112, and the second drain region 112' are within a projection area of the first conductive layer 134. In some embodiments, the entire first drain region 112 and the entire second drain region 112' are within a projection area of the first conductive layer 134. In some embodiments, the first conductive layer 134 can be made of silicide or other suitable materials, such as metal-derivatives or metal based materials. A Schottky barrier interface 100B1 is formed at an interface between the first conductive layer 134 and the upper portion 101P of the first dopant region 101. That is, a potential barrier is created at an interface between the first conductive layer 134 and the upper portion 101P of the first dopant region 101. The Schottky barrier interface 100B1 may be deemed as a junction of the guiding unit 100B depicted in FIG. 1A and FIG. 1B. The first diode junction 100A1 and the second diode junction 100A2 may be deemed as a junction of the body diode 100A depicted in FIG. 1A and FIG. 1B. The Schottky barrier interface 100B1 may be coplanar with the top surface 102T of the first channel region 102, the top surface 102T' of the second channel region 102', the top surface 111T of the first drift region 111, the top surface 111T' of the second drift region 111', the top surface 114T of the first source region 114, the top surface 114T' of the second source region 114', the top surface 112T of the first drain region 112, the top surface 112T' of the second drain region 112', and the top surface 101T of the first dopant region 101. The upper portion 101P of the first dopant region 101 of the substrate 100S is between the first diode junction 100A1 and the second diode junction 100A2.

The first source region 114 is in direct contact with a second conductive layer 135. The second source region 114' is in direct contact with a third conductive layer 135'. A material of the second conductive layer 135 and the third conductive layer 135' may be similar to a material of the first conductive layer 134.

The first conductive layer 134, the second conductive layer 135, and the third conductive layer 135' may be used as pick-up layers. Particularly, the first conductive layer 134 picks up three conductive paths, including a path that passes through the first diode junction 100A1 and the first drain region 112, a path that passes through the second diode junction 100A2 and the second drain region 112', and a path that passes through the Schottky barrier interface 100B1. The aforesaid three conductive paths are substantially in parallel, or they occur concurrently or independently from each other.

A first gate structure 120 is disposed over each of the first region RA, and a second gate structure 120' is disposed over the second region RB. The first gate structure 120 is disposed above the first channel region 102 and the first drift region 111. The second gate structure 120' is disposed above the second channel region 102' and the second drift region 111'. In some embodiments, the first gate structure 120 is disposed directly above the first diode junction 100A1, and the second gate structure 120' is disposed directly above the second diode junction 100A2. The first gate structure 120 has a gate electrode 121 that overlaps the first channel region 102 and the first drift region 111 in a vertical direction (Z-direction); and the second gate structure 120' has a gate electrode 121 overlaps the second channel region 102' and the second drift region 111' in the vertical direction. Each of the first gate structure 120 and the second gate structure 120' further has a gate layer 123 (such as oxide layer) between the gate electrode 121 and the substrate 100S, and a spacer layer 122 arranged on the sidewalls of the gate electrode 121. In some embodiments, a side of the first drain region 112 is aligned with a side of the spacer layer 122. In some embodiments, a side of the second area 113 of the first source region 114 is aligned with another side of the spacer layer 122. The first gate structure 120 and the second gate structure 120' may be deemed as part of the second transistor M2 depicted in FIG. 1A and FIG. 1B.

Plugs 132, which include conductive materials, are electrically coupled to the first conductive layer 134, the second conductive layer 135, the third conductive layer 135', and the gate electrodes 121 of the first gate structure 120 and the second structure 120'. The plugs 132 are further electrically connected to the metal lines 133. The semiconductor structure 200A further includes an insulation layer 131 over the substrate 100S, wherein the insulation layer 131 laterally surrounds the plugs 132, the metal lines 133, the first gate structure 120, and the second gate structure 120'.

In some embodiments, a width W102 of the first channel region 102, a width W111 of the first drift region 111, a width W112 of the first drain region 112, and the width W114 of the first source region 114 may be similar, comparable, or identical. In some embodiments, a length L112 of the first drain region 112 may be in a range from about 0.1 μm to about 5 μm.

In some embodiments, an isolation element 309 is disposed in the fourth region RD, wherein the isolation element 309 has insulation material that at least partially surrounds the first drift region 111, the second drift region 111', the first drain region 112, the second drain region 112', the first source region 114, the second source region 114', and the upper portion 101P of the first dopant region 101 in a lateral direction. In some embodiments, a portion of the substrate 100S at a peripheral area of the first region RA and the second region RB may also be laterally surrounded by the isolation element 309 in a lateral direction. In some embodiments, the isolation element 309 may include one or more ring structures that can alleviate electrical interference from other device area and/or diffusion from other device area.

Figure 3:
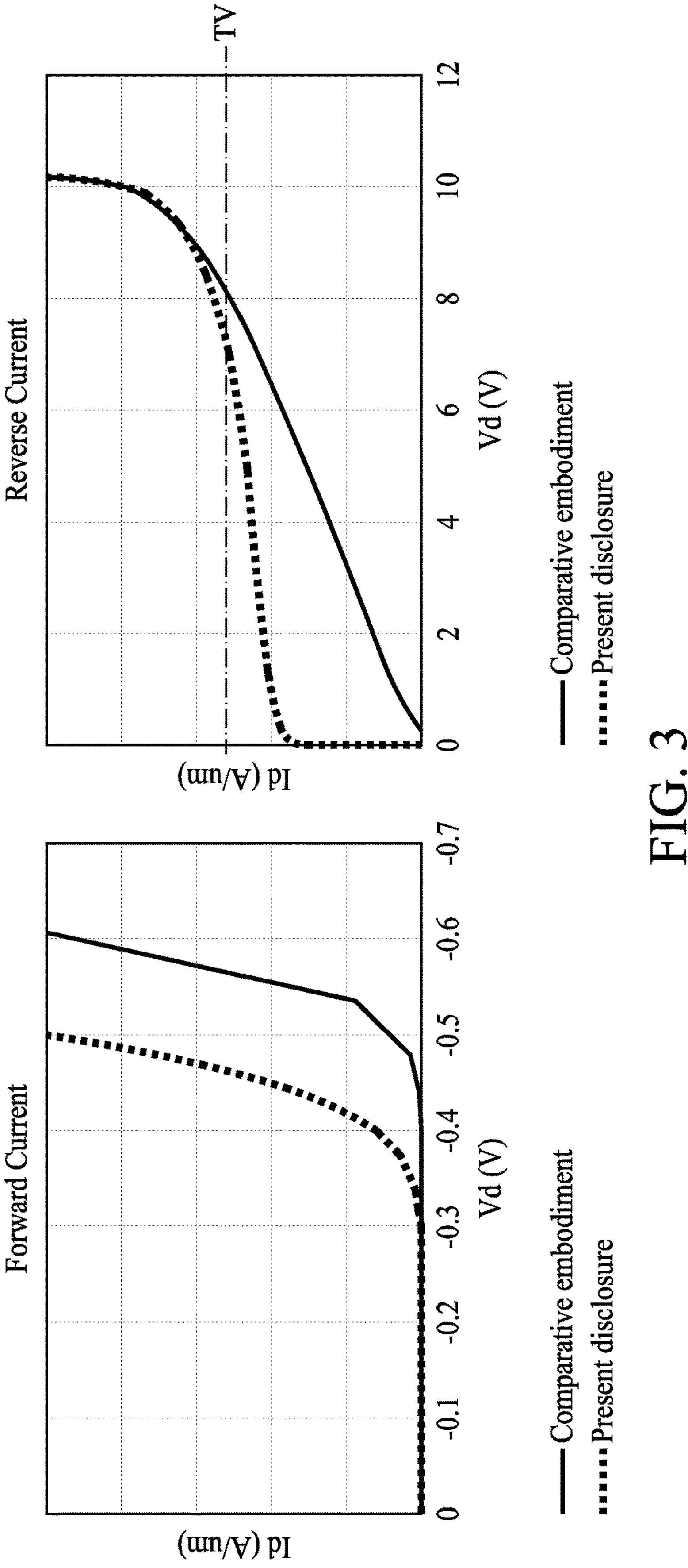
FIG. 3 is a schematic diagram showing simulation results of a circuit illustrated in FIG. 1A and FIG. 1B and a comparative embodiment of a circuit without guiding unit.

Referring to FIG. 3, FIG. 3 is a schematic diagram showing simulation results of a circuit illustrated in FIG. 1A and FIG. 1B and a comparative embodiment of a circuit without guiding unit. In a comparative embodiment free from a guiding unit 100B, the body diode 100A has a greater forward threshold, and thus has a greater power loss when switching between the non-conducting state and the conducting state. Further, the charging current would flow through the body diode 100A, and the undesired body diode reverse recovery is incurred.

In contrast, the guiding unit 100B (which may include may include a Schottky diode) has a forward threshold voltage lower than that of the body diode 100A, as shown on the left hand side of FIG. 3. Accordingly, the guiding unit 100B is conducted before the body diode 100A is conducted, such that the leakage current along the second path P2 (shown in FIG. 1B) in response to switching from conducting state to non-conducting state can be guided through guiding unit 100B instead of the body diode 100A. Thereby, the body diode reverse recovery issue is alleviated or even eliminated in some embodiments. The guiding unit 100B may also provide switch inductor current before the body diode 100A is turned on again. Further, a value of the leakage current can stay under control. That is, the value of the leakage current may stay below a threshold value VT as shown on the right hand side of FIG. 3. For example, the threshold value VT can be around 1.2 pA/μm for a circuit that operates under 5V, but the present disclosure is not limited thereto.

Some embodiments of method for forming a semiconductor structure 200A are depicted in FIG. 4 and FIG. 5A to FIG. 5E.

Figure 4:
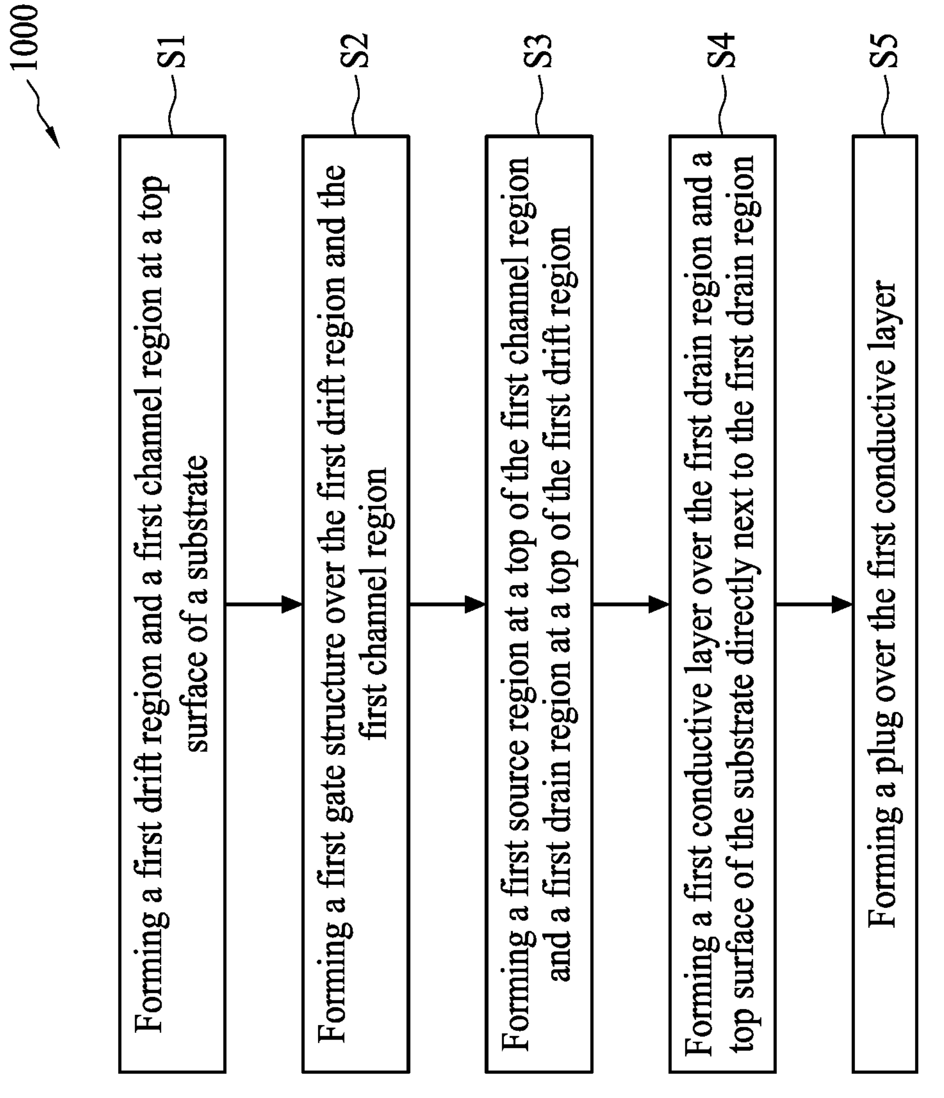
FIG. 4 shows a flow chart representing a method for fabricating a semiconductor device, in accordance with some embodiments of the present disclosure.

Referring to FIG. 4, FIG. 4 shows a flow chart representing a method for fabricating a semiconductor device, in accordance with some embodiments of the present disclosure. The method 1000 for fabricating a semiconductor device includes forming a first drift region and a first channel region at a top surface of a substrate (operation S1, which corresponds to FIG. 5B), forming a first gate structure over the first drift region and the first channel region (operation S2, which corresponds to FIG. 5C), forming a first source region at a top of the first channel region and a first drain region at a top of the first drift region (operation S3, which corresponds to FIG. 5D), forming a first conductive layer over the first drain region and a top surface of the substrate directly next to the first drain region (operation S4, which corresponds to FIG. 5E), and forming a plug over the first conductive layer (operation S5, which corresponds to FIG. 5E).

Figure 5A:
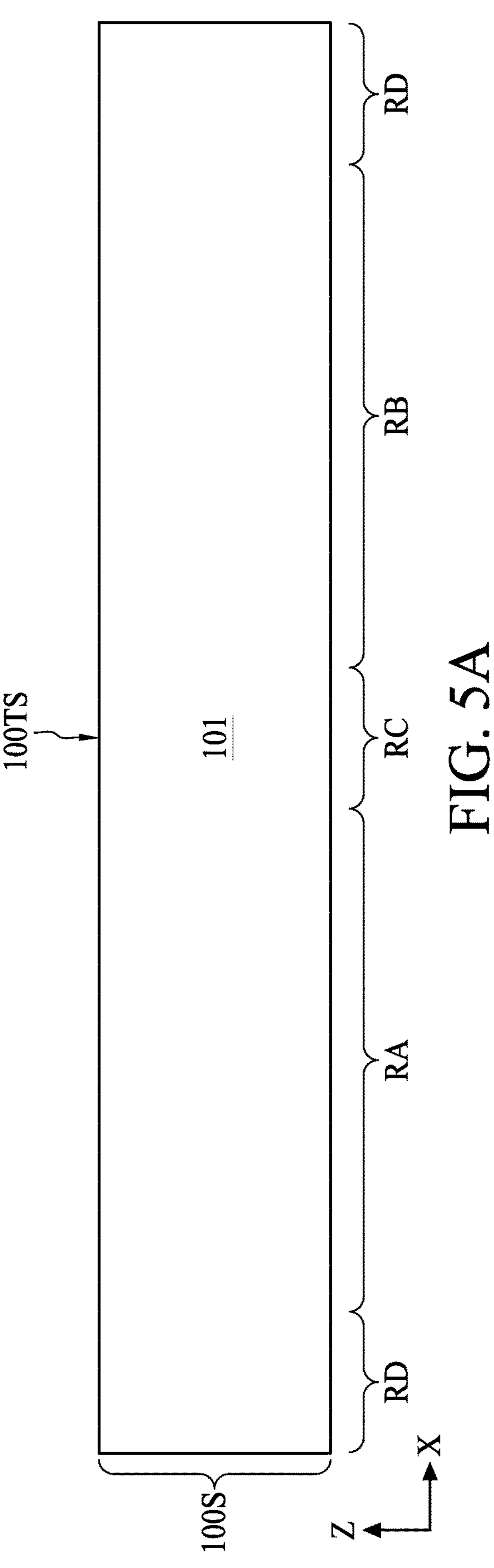
FIG. 5A to FIG. 5E are cross sectional views of a semiconductor device during intermediate stages of manufacturing operations, according to some embodiments of the present disclosure.

Referring to FIG. 5A, FIG. 5A is a cross sectional view of a semiconductor device during intermediate stages of manufacturing operations, according to some embodiments of the present disclosure. A substrate 100S is received. The substrate 100S includes a first dopant region 101, which has a first conductivity type dopant. In some embodiments, the first conductivity type dopant is P-type dopant, and the first dopant region 101 is a P-type region. A concentration of the first conductivity type dopant in the first dopant region is in a range from about 1E15 $cm^{-3}$ to about 1E16 $cm^{-3}$. In some embodiments, the substrate 100S includes silicon. The substrate 100S may be a lightly doped P-type substrate or a substrate that inherently includes slight amount of P-type dopant.

The substrate 100S includes a first region RA, a second region RB, a third region RC, and a fourth region RD. The third region RC is between the first region RA and the second region RB. The first region RA is separated from the second region RB by the third region RC. The first region RA, the second region RB and the third region RC are at least partially surrounded by the fourth region RD in a lateral direction. The substrate 100S has a top surface 100TS. In some embodiments, an isolation element (not shown in FIG. 5A, but can be referred to the isolation element 309 depicted in FIG. 2') can be formed in the fourth region RD.

Figure 5B:
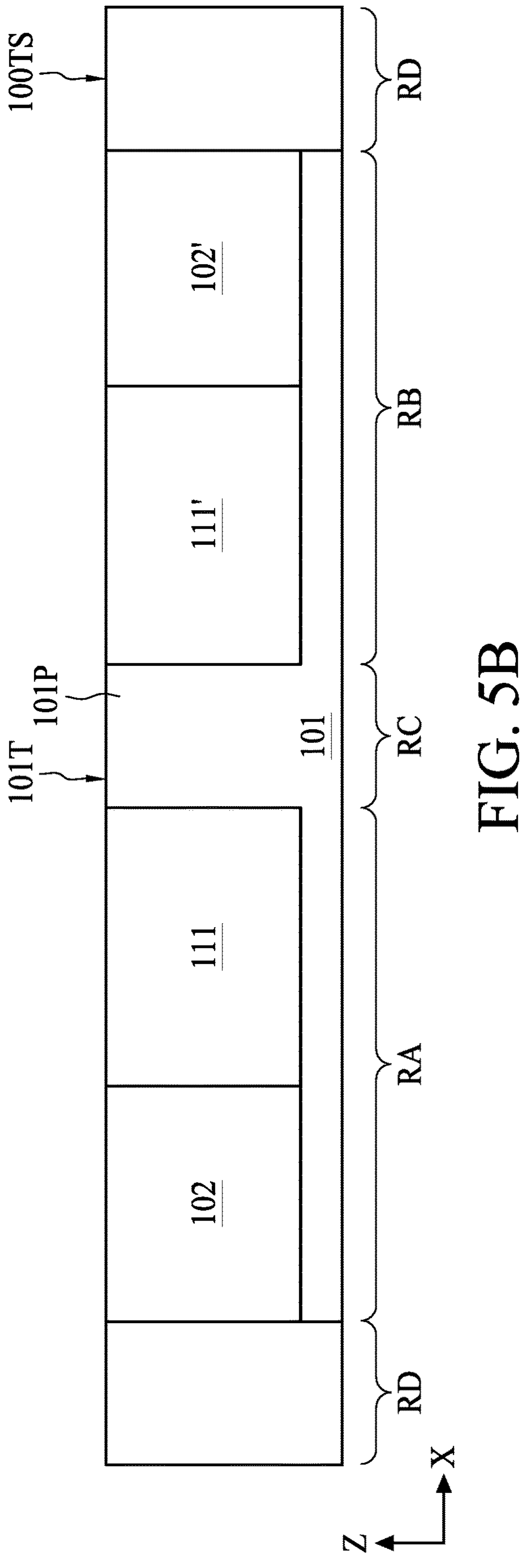

Referring to FIG. 5B, FIG. 5B is a cross sectional view of a semiconductor device during intermediate stages of manufacturing operations, according to some embodiments of the present disclosure. In operation S1 (shown in FIG. 4), a first channel region 102, a second channel region 102', a first drift region 111, and a second drift region 111' are defined and formed at the top surface 100TS of the substrate 100S by implantation operation. The first drift region 111 and the second drift region 111' are between the first channel region 102 and the second channel region 102'. The first drift region 111 and the first channel region 102 are defined over the first region RA. The second drift region 111' and the second channel region 102' are defined over the second region RB. The first drift region 111 is directly next to the first channel region 102, and the second drift region 111' is directly next to the second channel region 102'.

The first channel region 102 and the second channel region 102' are doped with the first conductivity type dopant. A concentration of dopant in the first channel region 102 and the second channel region 102' are greater than the concentration of dopant in the first dopant region 101. For example, the concentration of dopant in the first channel region 102 and the second channel region 102' may be in a range from about 1E17 $cm^{-3}$ to about 1E19 $cm^{-3}$.

The first drift region 111 and the second drift region 111' are doped with a second conductivity type dopant. In some embodiments, the second conductivity type dopant is different from the first conductivity type dopant. In some embodiments, the second conductivity type dopant is N-type dopant. A concentration of dopant in the first drift region 111 and the second drift region 111' may be in a range from about 1E17 $cm^{-3}$ to about 1E19 $cm^{-3}$.

An upper portion 101P of the first dopant region 101 is over the third region RC and is between the first drift region 111 and the second drift region 111'. That is, the first drift region 111 is separated from the second drift region 111' by the upper portion 101P of the first dopant region 101. The upper portion 101P has a top surface 101T level with the top surface 100TS of the substrate 100S.

Figure 5C:
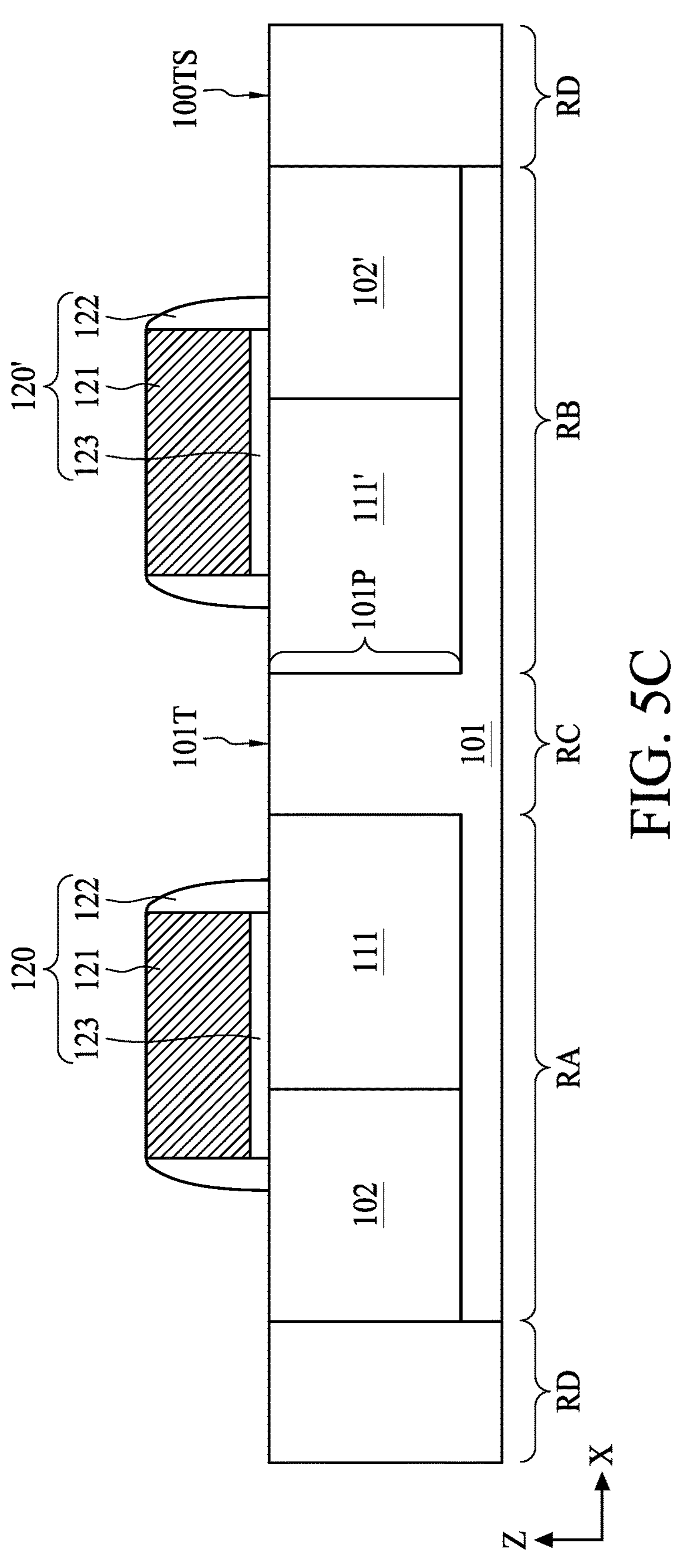

Referring to FIG. 5C, FIG. 5C is a cross sectional view of a semiconductor device during intermediate stages of manufacturing operations, according to some embodiments of the present disclosure. In operation S2 (shown in FIG. 4), a first gate structure 120 is formed over the first region RA, and a second gate structure 120' is formed over the second region RB. The first gate structure 120 overlaps an interface between the first drift region 111 and the first channel region 102 in the vertical direction, the second gate structure 120' overlaps an interface between the second drift region 111' and the second channel region 102'. Each of the first gate structure 120 and the second gate structure 120' has a gate layer 123 (such as an oxide layer) over the top surface 100TS of the substrate 100S, a gate electrode 121 over the gate layer 123, and a spacer layer 122 lining at the sidewalls of the gate electrode 121. The top surface 101T of the upper portion 101P of the first dopant region 101 is free from being within a projection area of the first gate structure 120 and/or the second gate structure 120'.

Figure 5D:
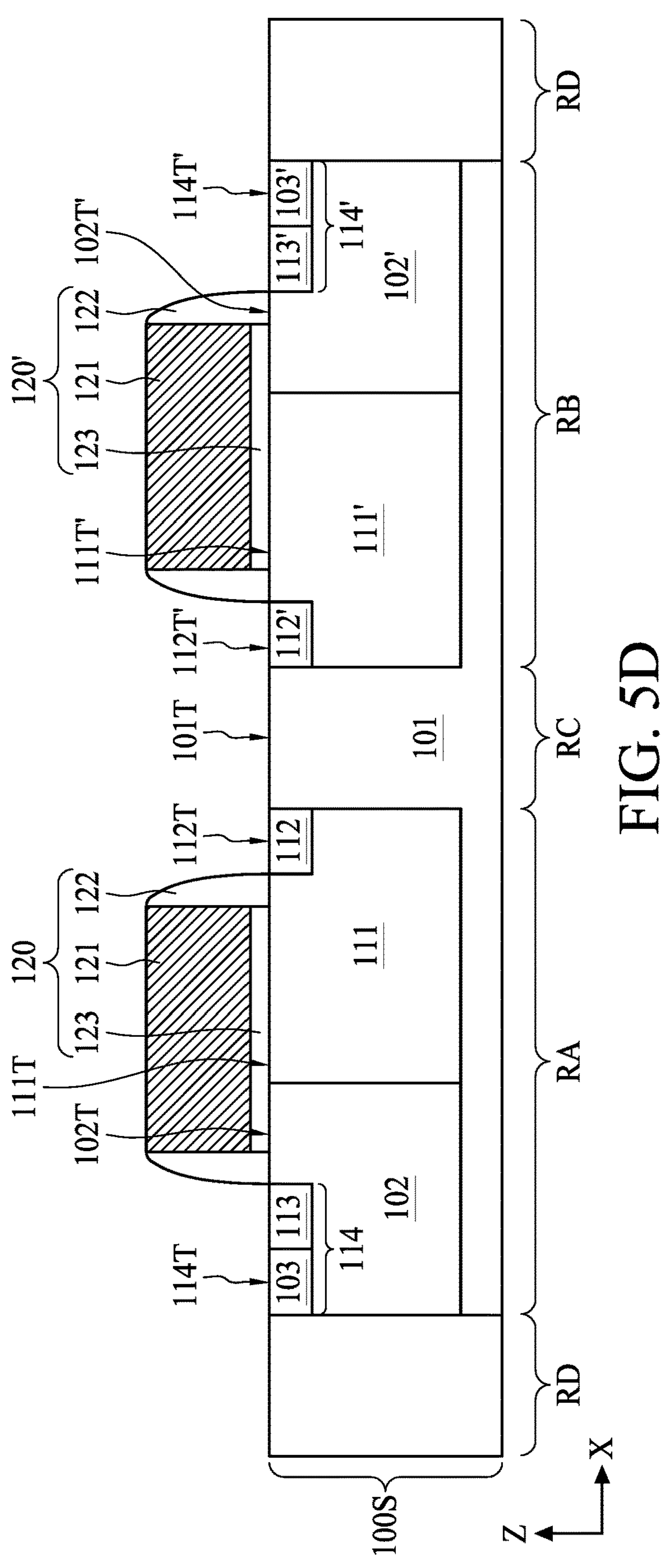

Referring to FIG. 5D, FIG. 5D is a cross sectional view of a semiconductor device during intermediate stages of manufacturing operations, according to some embodiments of the present disclosure. In operation S3 (shown in FIG. 4), an implanting operation (such as a self-alignment implanting operation) is performed to define the positions of the first source region 114, the second source region 114', the first drain region 112, and the second drain region 112' at the top surface 100TS of the substrate 100S. The first drain region 112 and the first source region 114 are formed over the first region RA. The second drain region 112' and the second source region 114' are formed over the second region RB. A side of the first source region 114, a side of the second source region 114', a side of the first drain region 112, and a side of the second drain region 112' may be respectively aligned with a side of one of the first gate structure 120 and the second gate structure 120'.

The upper portion 101P of the first dopant region 101 is between the first drain region 112 and the second drain region 112'. That is, the first drain region 112 is separated from the second drain region 112' by the upper portion 101P of the first dopant region 101. The first drain region 112 and the second drain region 112' are respectively directly next to the upper portion 101P of the first dopant region 101. The first source region 114 further includes a first area 103 and a second area 113 adjacent to the first region 103. The second source region 114' further includes a third area 103' and a fourth area 113' adjacent to the third region 103'.

The first drain region 112 and the second drain region 112' are doped with the second conductivity type dopant. A concentration of dopant in the first drain region 112 and the second drain region 112' are greater than the concentration of dopant in the first drift region 111 and the second drift region 111'. For example, the concentration of dopant in the first drain region 112 and the second drain region 112' may be in a range from about 1E19 $cm^{-3}$ to about 1E21 $cm^{-3}$. In some embodiments, the first drain region 112 and the second drain region 112' are N+ regions.

The first area 103 of the first source region 114 and the third area 103' of the second source region 114' are doped with the first conductivity type dopant. A concentration of dopant in the first area 103 and the third area 103' are greater than the concentration of dopant in the first channel region 102 and the second channel region 102'. For example, the concentration of dopant in the first area 103 and the third area 103' may be in a range from about 1E19 $cm^{-3}$ to about 1E21 $cm^{-3}$. In some embodiments, the first area 103 and the third area 103' are P+ regions.

The second area 113 of the first source region 114 and the fourth area 113' of the second source region 114' are doped with the second conductivity type dopant. A concentration of dopant in the second area 113 and the fourth area 113' are greater than the concentration of dopant in the first drift region 111 and the second drift region 111'. For example, the concentration of dopant in the second area 113 and the fourth area 113' may be in a range from about 1E19 $cm^{-3}$ to about 1E21 $cm^{-3}$. In some embodiments, the second area 113 of the first source region 114 and the fourth area 113' of the second source region 114' are N+ regions.

Figure 5E:
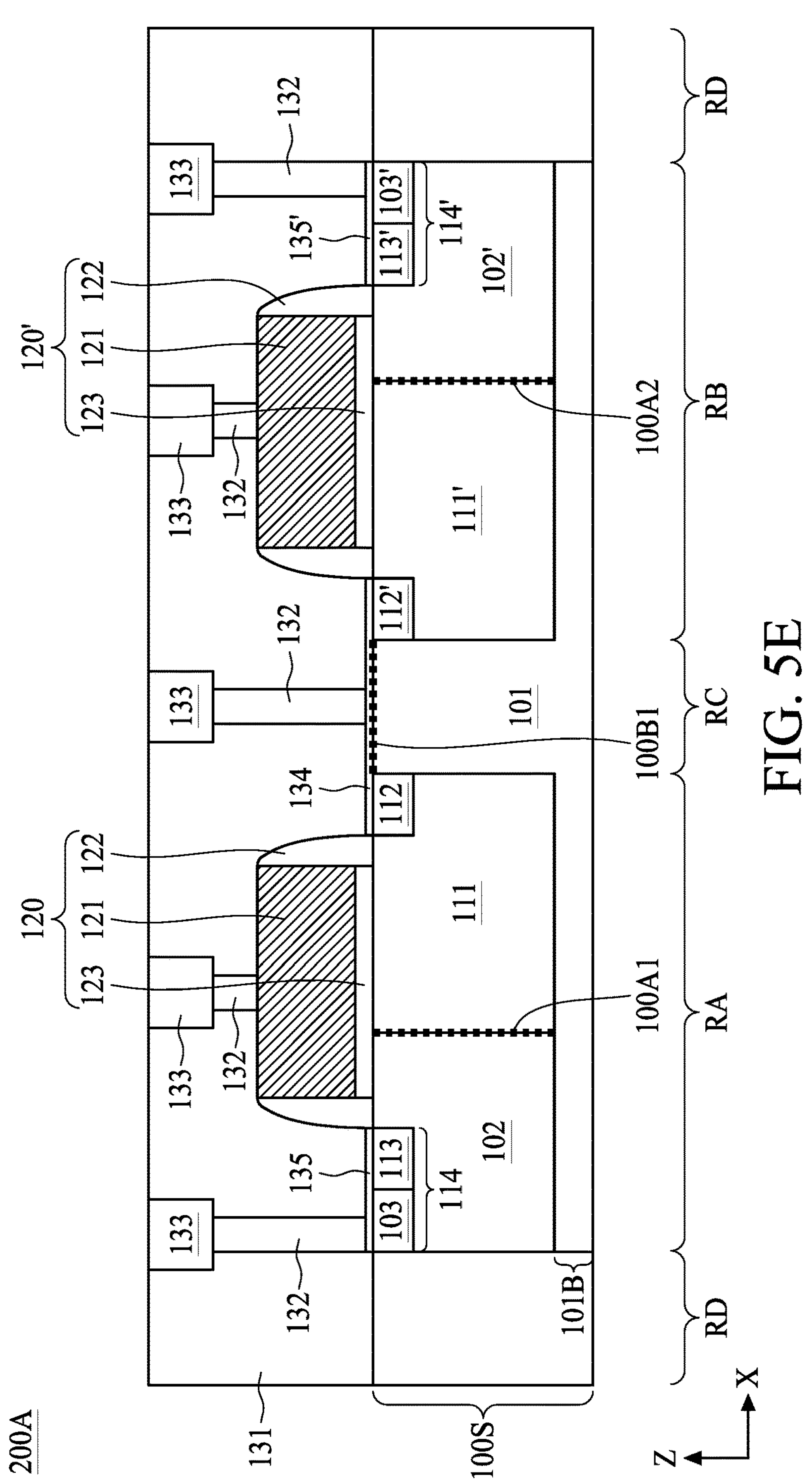

Referring to FIG. 5E, FIG. 5E is a cross sectional view of a semiconductor device during intermediate stages of manufacturing operations, according to some embodiments of the present disclosure. In operation S4 (shown in FIG. 4), a first conductive layer 134 is formed over (may be directly in contact with) the top surface 101T of the first dopant region 101, the first drain region 112, and the second drain region 112'. In some embodiments, at least a portion of the upper portion 101P of the first dopant region 101, the first drain region 112, and the second drain region 112' are within a projection area of the first conductive layer 134. In some embodiments, the entire first drain region 112 and the entire second drain region 112' are within a projection area of the first conductive layer 134. In some embodiments, the first conductive layer 134 is made of silicide or other suitable materials, such as metal-derivatives or metal-based materials. A Schottky barrier interface 100B1 is formed at an interface between the first conductive layer 134 and the upper portion 101P of the first dopant region 101. That is, a potential barrier is created at an interface between the first conductive layer 134 and the upper portion 101P of the first dopant region 101.

Further, a second conductive layer 135 is formed over the first source region 114, and a third conductive layer 135' is formed over the second source region 114'. A material of the second conductive layer 135 and the third conductive layer 135' may be similar to a material of the first conductive layer 134. A first diode junction 100A1 is formed at an interface between the first channel region 102 and the first drift region 111. A second diode junction 100A2 is formed at an interface between the second channel region 102' and the second drift region 111'.

An insulation layer 131 is formed over the substrate 100S, wherein the insulation layer 131 covers the first gate structure 120, the second gate structure 120', the first conductive layer 134, the second conductive layer 135 and the third conductive layer 135'.

In operation S5 (as shown in FIG. 4), plugs 132 are formed through the insulation layer 131 over the first gate structure 120, the second gate structure 120', the first conductive layer 134, the second conductive layer 135 and the third conductive layer 135'. The plugs 132 include conductive materials. Metal lines 133 are further formed to be electrically connected to the plugs 132. Thereby, the semiconductor device 200A is formed.

Alternative embodiments that can be implemented as part of the semiconductor device 200 depicted in FIG. 1A and FIG. 1B, including but not limited to, a semiconductor device 200B (shown in FIG. 6), a semiconductor device 200C (shown in FIG. 7 or FIG. 7'), a semiconductor device 200D (shown in FIG. 8), and a semiconductor device 200E (shown in FIG. 9) will be subsequently discussed.

Figure 6:
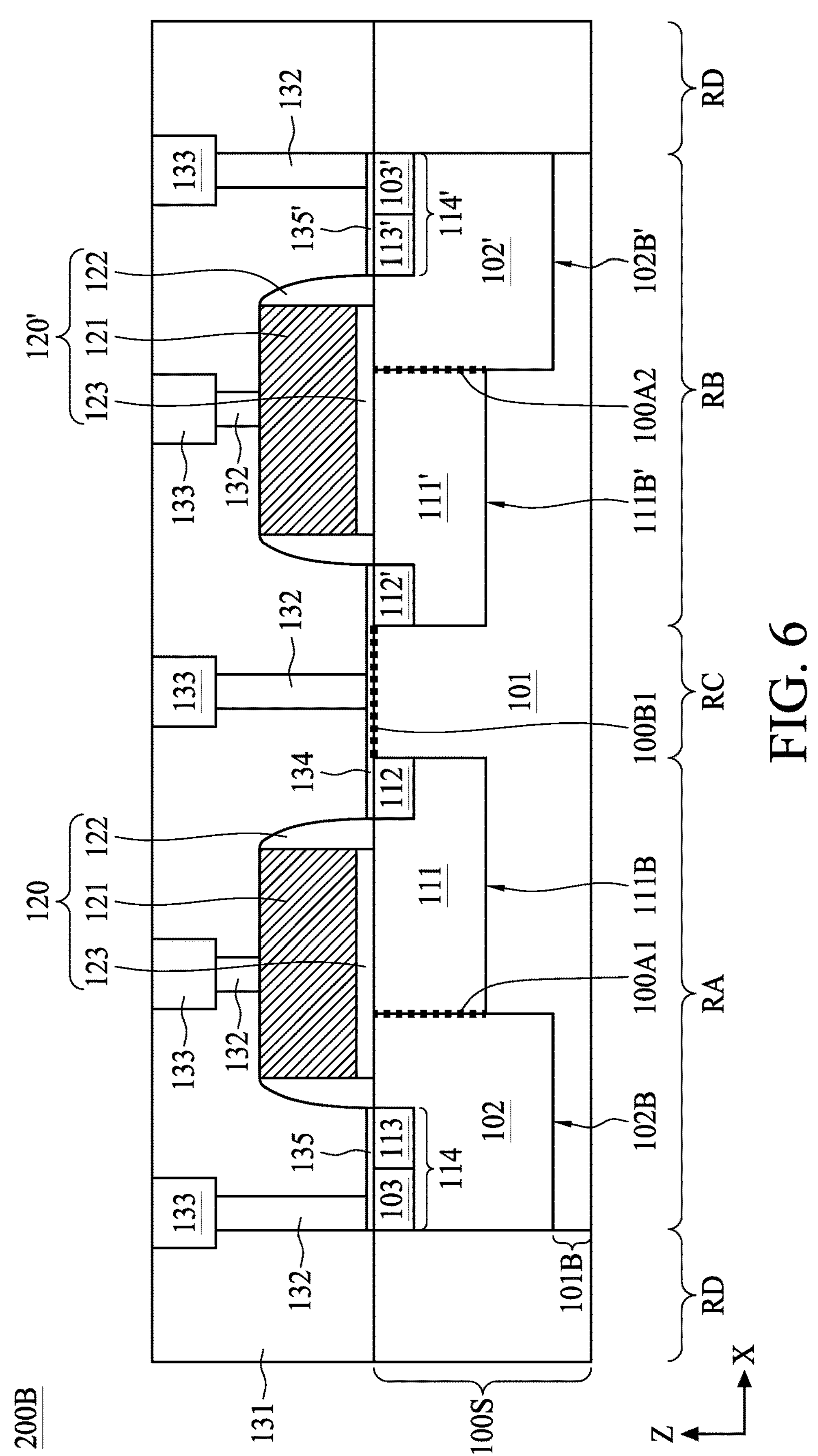
FIG. 6 is a cross sectional view of a semiconductor device, according to some embodiments of the present disclosure.

Referring to FIG. 6, FIG. 6 is a cross sectional view of a semiconductor device, according to some embodiments of the present disclosure. The semiconductor device 200B depicted in FIG. 6 is similar to the semiconductor device 200A depicted in FIG. 2 and FIG. 2'. The difference resides in that a bottom 111B of the first drift region 111 and a bottom 111B' of the second drift region 111' are above a bottom 102B of the first channel region 102 and a bottom 102B' of the second channel region 102'. In some embodiments, the first drift region 111 and the second drift region 111' does not have any portion extending under the first channel region 102, the second channel region 102', as well as the first dopant region 101. A portion of the first dopant region 101 is adjacent to a sidewall of the first channel region 102 and a sidewall of the second channel region 102'.

Figure 7:
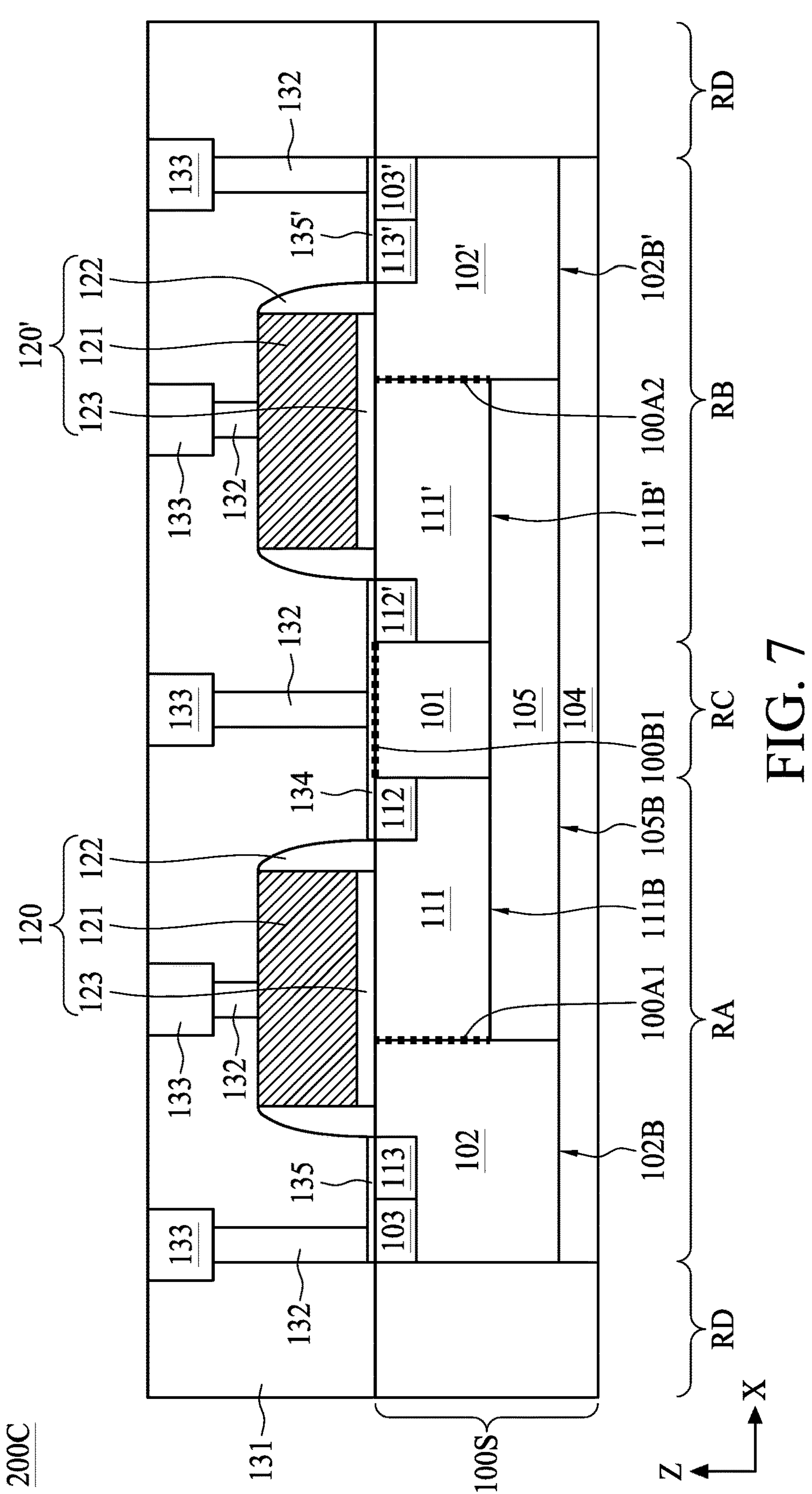
FIG. 7 is a cross sectional view of a semiconductor device, according to some embodiments of the present disclosure.
Figure 7:
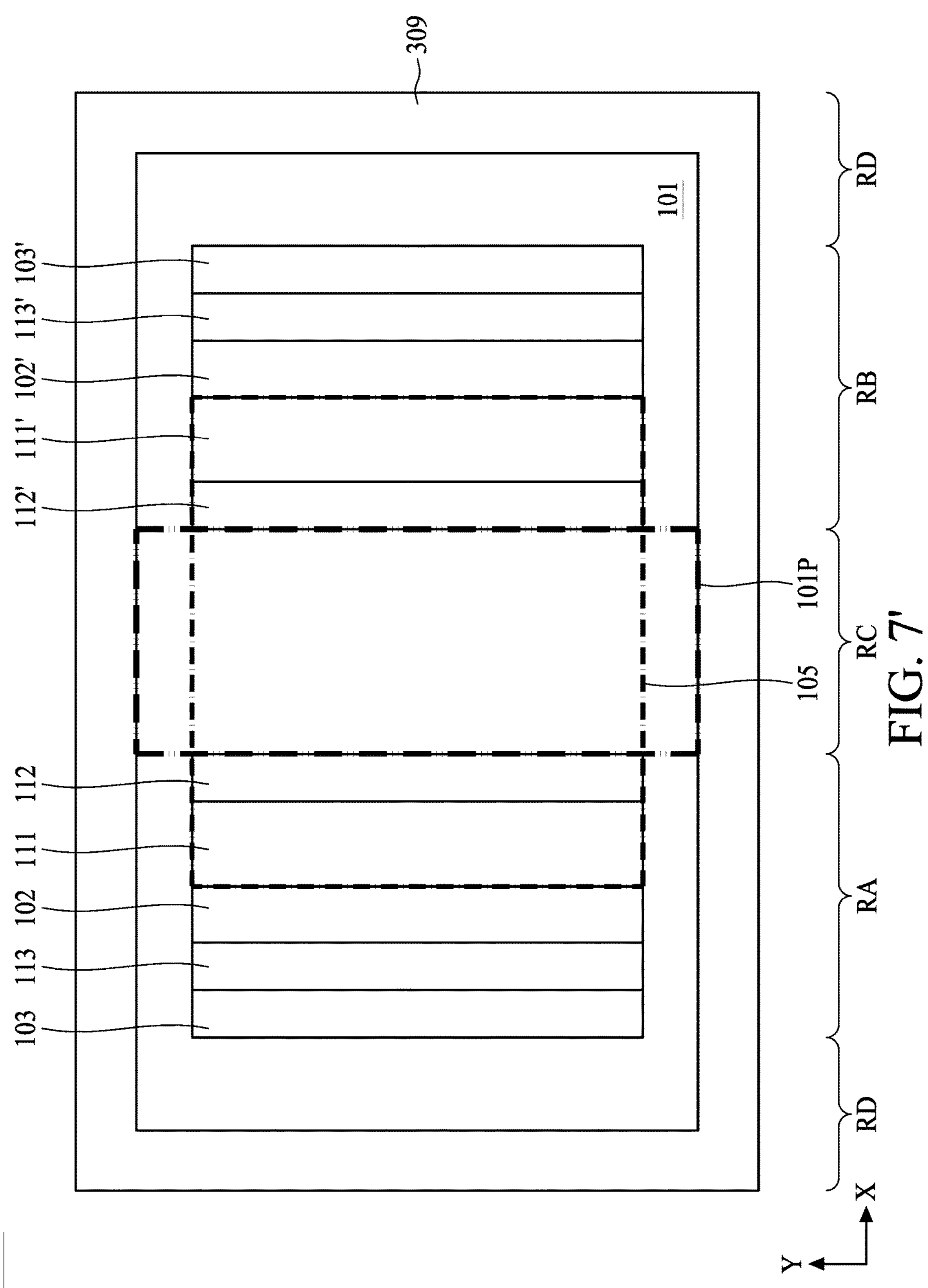

Referring to FIG. 7 and FIG. 7'. FIG. 7 is a cross sectional view of a semiconductor device, and FIG. 7' is a top view of a semiconductor device, according to some embodiments of the present disclosure. The semiconductor device 200C depicted in FIG. 7 and FIG. 7' is similar to the semiconductor device 200B depicted in FIG. 6. The difference resides in that the semiconductor device 200C further includes a deep well region 105 extending from a position below a bottom 111B of the first drift region 111 to a bottom 111B' of the second drift region 111'. The deep well region 105 is doped with the first conductivity type dopant (such as P-type dopant). A concentration of dopant in the deep well region 105 is greater than the concentration of dopant in the first dopant region 101. A bottom 105B of the deep well region 105 may level with a bottom 102B of the first channel region 102 and a bottom 102B' of the second channel region 102'. The semiconductor device 200C may further include a buried layer 104 extending from a position under the bottom 102B of the first channel region 102 to under a position the bottom 102B' of the second channel region 102'. A portion of the deep well region 105 and a portion of the buried layer 104 may overlap the upper portion 101P of the first dopant region 101 in a vertical direction. In some embodiments, the buried layer 104 is doped with second conductivity type dopant (such as N-type dopant), and the buried layer 104 may be referred to as N-type buried layer (NBL).

Figure 8:
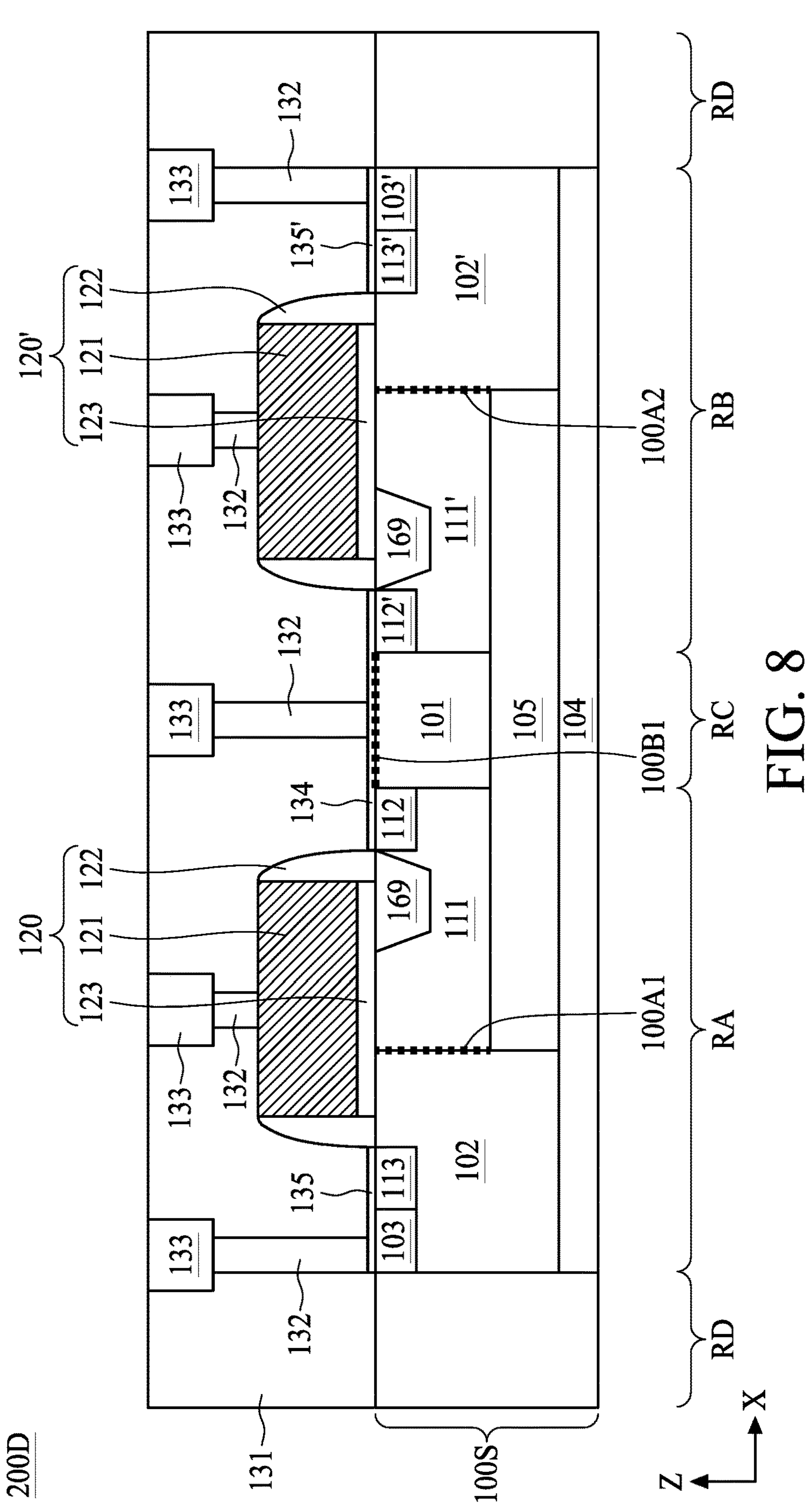
FIG. 8 is a cross sectional view of a semiconductor device, according to some embodiments of the present disclosure.

Referring to FIG. 8, FIG. 8 is a cross sectional view of a semiconductor device, according to some embodiments of the present disclosure. The semiconductor device 200D depicted in FIG. 8 is similar to the semiconductor device 200C depicted in FIG. 7 and FIG. 7'. The difference resides in that the semiconductor device 200D further includes isolation regions 169 in the first drift region 111 and the second drift region 111'. The isolation regions 169 can be utilized to adjust a threshold voltage of the body diodes (the diode that has the first diode junction 100A1 and the diode that has the second diode junction 100A2). In some embodiments, the isolation regions 169 include electrical insulation materials, such as oxide-based material. The isolation regions 169 may be disposed within a projection area of the first gate structure 120 and the second gate structure 120'.

Figure 9:
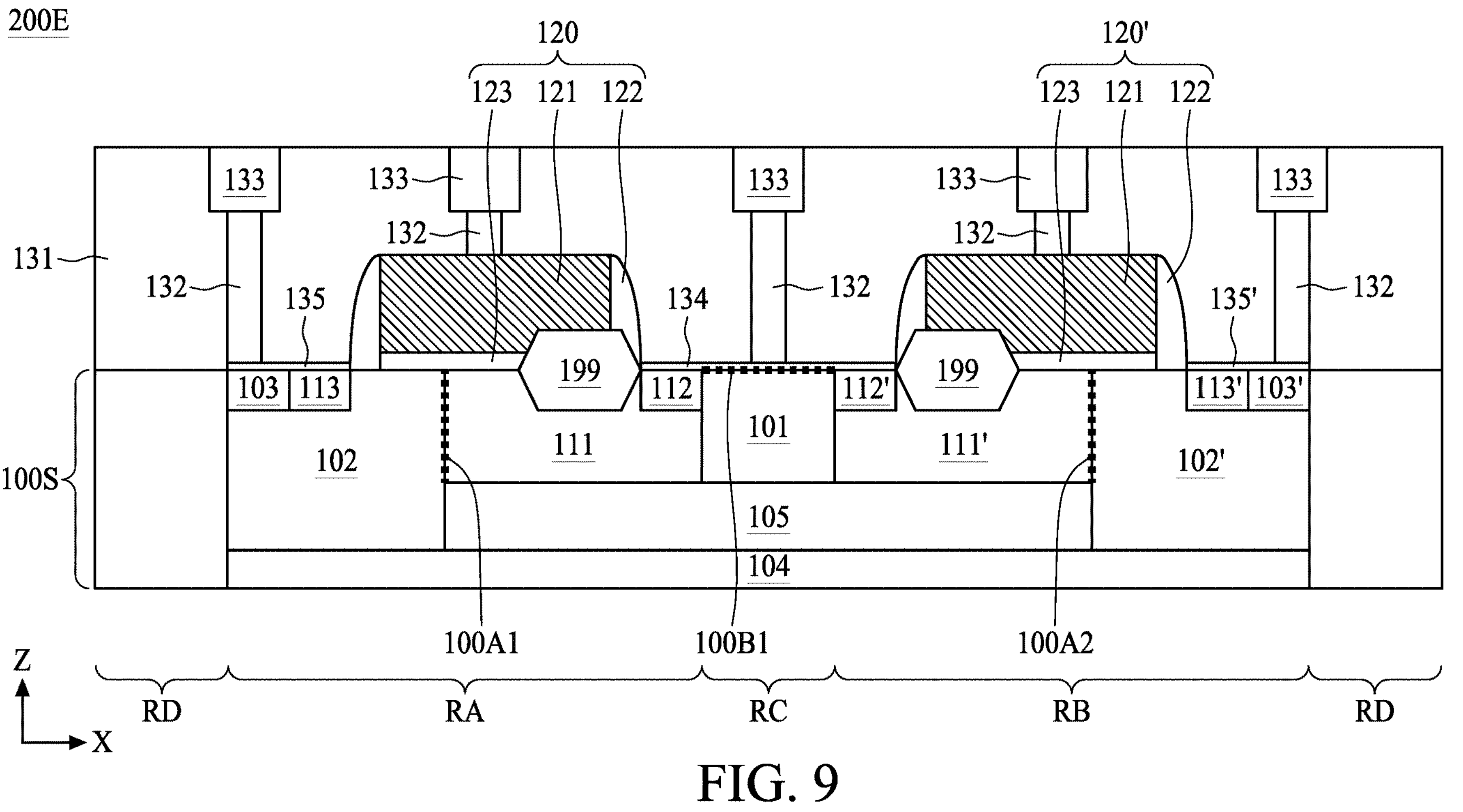
FIG. 9 is a cross sectional view of a semiconductor device, according to some embodiments of the present disclosure.

Referring to FIG. 9, FIG. 9 is a cross sectional view of a semiconductor device, according to some embodiments of the present disclosure. The semiconductor device 200E depicted in FIG. 9 is similar to the semiconductor device 200D depicted in FIG. 8. The difference resides in that, instead of isolation regions 169, the semiconductor device 200E includes local oxidation silicon (LOCOS) regions 199 in the first drift region 111 and the second drift region 111'. A portion of the LOCOS regions 199 may protrude from the substrate 100S. The LOCOS regions 199 can be utilized to adjust a threshold voltage of the body diodes (the diode that has the first diode junction 100A1 and the diode that has the second diode junction 100A2). The LOCOS regions 199 may be disposed within a projection area of the first gate structure 120 and the second gate structure 120'.

In summary, the present disclosure provides some embodiments of semiconductor devices that help alleviating the issue resulting from reverse recovery current and voltage overshoot, which limits the efficiency, maximum operable switching frequency of a power device, device performance, reliability, et cetera. The issue caused by reverse recovery current is particularly significant when switching a circuit from conducting state to a non-conducting state, which would experience a period of dead time.

The present disclosure provides some embodiments of semiconductor device incorporated with a Schottky barrier interface and method for forming the same to address the aforesaid issues. By implementing a device that has a Schottky barrier interface (please refer to the guiding unit 100B in FIG. 1A and FIG. 1B), a significant portion of the current from the reference level GND towards the output during the dead time flows through the guiding unit 100B instead of the body diode 100A since the guiding unit 100B is conducted before the body diode 100A is conducted. Thereby, the body diode reverse recovery issue is alleviated or even eliminated in some embodiments. The guiding unit 100B may also provide switch inductor current before the body diode 100A is turned on again.

In a comparative embodiment free from a guiding unit 100B, the charging current would flow through the body diode 100A, and the undesired body diode reverse recovery is incurred. In the case of operating with greater switching frequency and/or greater operating current, the issue of voltage overshoot and power loss become more significant, thus decreasing device performance.

The Schottky barrier interface is embedded in the semiconductor device 200A (shown in FIG. 2 or FIG. 2'), the semiconductor device 200B (shown in FIG. 6), the semiconductor device 200C (shown in FIG. 7 or FIG. 7'), the semiconductor device 200D (shown in FIG. 8), and the semiconductor device 200E (shown in FIG. 9). In the aforementioned embodiments (or other embodiments similar thereto), the device density can be greatly improved, compared to using an external Schottky diode, which requires more space and defy the purpose of shrinking critical dimension of device in advanced technology nodes. Further, switching power loss can be reduced, and efficiency can be improved in power switching application. In addition, voltage overshoot (which has positive correlation with reverse recovery behavior) can be alleviated, such that the performance degradation can also be alleviated. Also, the method for fabricating the semiconductor device 200A (which can be applied to methods for fabricating the semiconductor device 200B, the semiconductor device 200C, the semiconductor device 200D, and the semiconductor device 200E) may avoid high-cost and high-complexity operations, such as extra operation that requires multiple masking layers.

Some embodiments of the present disclosure provide a semiconductor device, including a substrate, a first dopant region in the substrate, wherein the first dopant is doped with a first conductivity type dopant, a first drift region at a top surface of the substrate, a first drain region adjacent to the first drift region, a second drain region, wherein an upper portion of the first dopant region is between the first drain region and the second drain region, and a first conductive layer connecting the first drain region, the second drain region, and a top surface of the upper portion of the first dopant region, wherein a Schottky barrier interface is formed between the top surface of the upper portion of the first dopant region and the first conductive layer.

Some embodiments of the present disclosure provide a semiconductor device, including a substrate, having a first region, a second region, and a third region, wherein the third region is between the first region and the third region, a first diode junction over the first region, a second diode junction over the second region, wherein a portion of the substrate is between the first diode junction and the second diode junction, a first portion of the substrate over the third region, wherein a portion of the first portion is between the first diode junction and the second diode junction, and a first conductive layer over a top surface the first portion of the substrate, wherein a Schottky barrier interface is formed between the top surface of the first portion of the substrate and the first conductive layer.

Some embodiments of the present disclosure provide a method for fabricating a semiconductor device, including forming a first drift region and a first channel region at a top surface of a substrate, forming a first gate structure over the first drift region and the first channel region, forming a first source region at a top of the first channel region and a first drain region at a top of the first drift region, forming a first conductive layer over the first drain region and a top surface of the substrate directly next to the first drain region, and forming a plug over the first conductive layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
- a substrate;
- a first dopant region in the substrate, wherein the first dopant region is doped with a first conductivity type dopant;
- a first drift region on a top surface of the substrate;
- a first drain region adjacent to the first drift region;
- a second drain region, wherein an upper portion of the first dopant region is between the first drain region and the second drain region; and
- a first conductive layer connecting the first drain region, the second drain region, and a top surface of the upper portion of the first dopant region, wherein a Schottky barrier interface is formed between the top surface of the upper portion of the first dopant region and the first conductive layer.

2. The semiconductor device of claim 1, wherein the first conductivity type dopant is P-type dopant.

3. The semiconductor device of claim 1, wherein the first drift region is doped with a second conductivity type dopant, and the second conductivity type dopant is different from the first conductivity type dopant.

4. The semiconductor device of claim 1, further comprising a first channel region adjacent to the first drift region.

5. The semiconductor device of claim 4, wherein the first channel region is doped with the first conductivity type dopant, and a concentration of the first conductivity type dopant in the first channel region is greater than a concentration of the first conductivity type dopant in the first dopant region.

6. The semiconductor device of claim 4, wherein a bottom of the first drift region is level with a bottom of the first channel region.

7. The semiconductor device of claim 4, wherein a bottom of the first drift region is above a bottom of the first channel region.

8. The semiconductor device of claim 4, further comprising a first gate structure over the substrate, wherein an interface between the first drift region and the first channel region is directly under the first gate structure.

9. The semiconductor device of claim 8, further comprising an isolation region disposed in the first drift region adjacent to the first drain region.

10. The semiconductor device of claim 9, wherein the isolation region overlaps the first gate structure.

11. A semiconductor device, comprising:
- a substrate, having a first region, a second region, and a third region, wherein the third region is between the first region and the second region;
- a first diode junction over the first region;
- a second diode junction over the second region, wherein a portion of the substrate is between the first diode junction and the second diode junction;
- a first portion of the substrate over the third region between the first diode junction and the second diode junction; and
- a first conductive layer over a top surface the first portion of the substrate, wherein a Schottky barrier interface is formed between the top surface of the first portion of the substrate and the first conductive layer.

12. The semiconductor device of claim 11, wherein the first portion of the substrate is doped with a P-type dopant, and a concentration of the P-type dopant is in a range from 1E15 atoms/$cm^3$ to 1E16 atoms/$cm^3$.

13. The semiconductor device of claim 11, further comprising a first drift region and a first channel region over the first region, wherein the first diode junction is at an interface between the first drift region and the first channel region.

14. The semiconductor device of claim 13, wherein a dopant concentration of the first channel region is greater than a dopant concentration of the substrate.

15. The semiconductor device of claim 11, wherein the first conductive layer comprises silicide.

16. A semiconductor device, comprising:
- a substrate comprising a first conductivity type dopant;
- a first drift region and a second drift region disposed in the substrate on a surface of the substrate and spaced apart from each other by a space of the substrate;
- a first drain region and a second drain region disposed in the first drift region and the second drift region, respectively; and
- a first conductive layer disposed over the substrate and covering the space, the first drain region and the second drain region, wherein a Schottky barrier interface is formed between an upper surface of the space and the first conductive layer.

17. The semiconductor device of claim 16, wherein the first drift region is doped with an N-type dopant with a concentration from about 1E17 atoms/$cm^3$ to about 1E19 atoms/$cm^3$.

18. The semiconductor device of claim 16, wherein the space is doped with a P-type dopant with a concentration from about 1E17 atoms/$cm^3$ to about 1E19 atoms/$cm^3$.

19. The semiconductor device of claim 16, wherein the first conductive layer comprises silicide.

20. The semiconductor device of claim 16, further comprising a first gate structure and a second gate structure disposed over the substrate and overlapping the first drift region and the second drift region, respectively.

* * * * *